United States Patent [19]
Maruyama

[11] Patent Number: 5,341,334
[45] Date of Patent: Aug. 23, 1994

[54] LEVEL SHIFTER CIRCUIT CONSTITUTED OF E AND I TYPE TRANSISTORS AND AN EEPROM USING THE SAME

[75] Inventor: Tadashi Maruyama, Yokohama, Japan

[73] Assignee: Kabushiki Kaisha Toshiba, Kawasaki, Japan

[21] Appl. No.: 115,031

[22] Filed: Sep. 1, 1993

[30] Foreign Application Priority Data

Sep. 2, 1992 [JP] Japan .................. 4-234965

[51] Int. Cl.$^5$ ............................. G11C 7/00
[52] U.S. Cl. ..................... 365/189.11; 365/230.06; 307/475
[58] Field of Search ............ 365/189.11, 230.06; 307/475, 296.1

[56] References Cited

U.S. PATENT DOCUMENTS

| | | | |
|---|---|---|---|
| 4,642,482 | 2/1987 | Kasperkovitz et al. | 307/475 |
| 5,031,149 | 7/1991 | Matsumoto et al. | 365/189.11 |
| 5,058,063 | 10/1991 | Wada et al. | 365/189.11 |
| 5,065,361 | 11/1991 | Yoshizawa et al. | |
| 5,202,855 | 4/1993 | Morton | 365/189.11 |

Primary Examiner—Eugene R. LaRoche
Assistant Examiner—Son Dinh
Attorney, Agent, or Firm—Oblon, Spivak, McClelland, Maier & Neustadt

[57] ABSTRACT

An input terminal inputs an input signal oscillating between a first power source voltage and second power source voltage according to a selected mode and a non-selected mode. An output terminal delivers a signal oscillating between the first and second power source voltages and a third power source voltage according to voltage conversion and non-voltage conversion. An N-channel E type transistor of a positive threshold voltage has a source electrode and a drain electrode connected between the input terminal and the output terminal and a gate electrode supplied with the second power source voltage. An N-channel I type transistor of a neutral threshold voltage has a source electrode and a drain electrode connected between the input terminal and the output terminal and a gate electrode supplied with a control signal oscillating between the first power source voltage and the second power source voltage, the control signal determining whether or not a voltage conversion is made. A charge pump circuit is connected to the output terminal and operative with the first, second and third power source voltages such that the charge pump circuit is rendered an active state only when the voltage conversion is mode. A predetermined number of level shifter circuits having an arrangement as set out above are connected between row and column decoders of an EEPROM on one hand and a cell matrix array on the other hand.

17 Claims, 7 Drawing Sheets

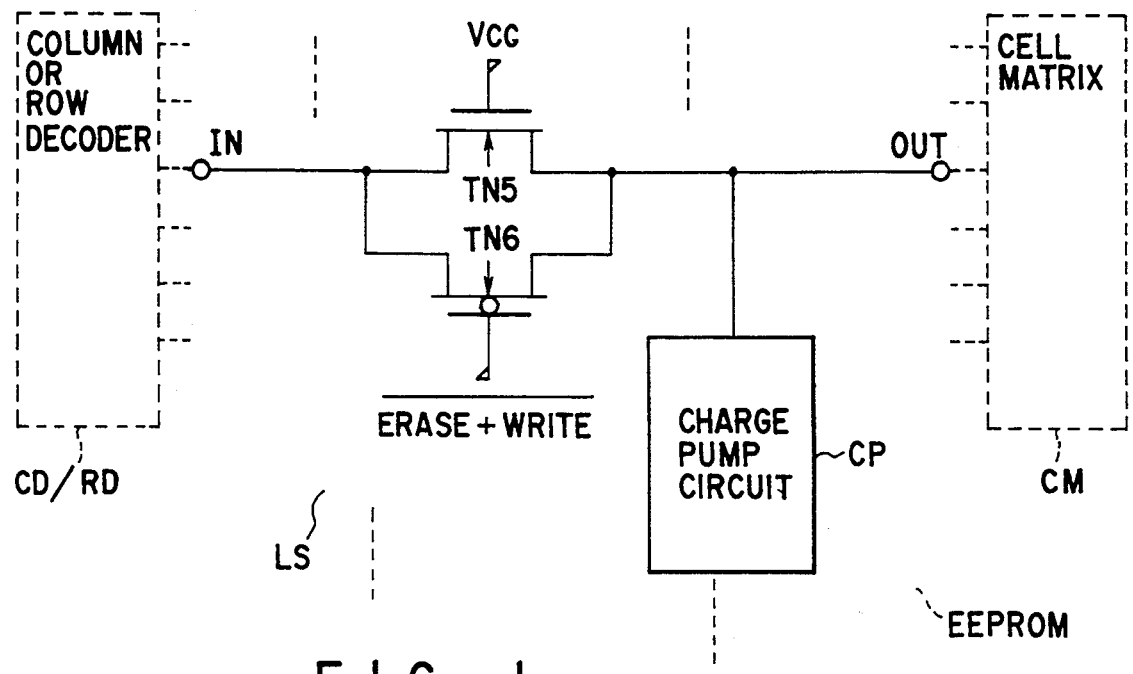
F I G. 1
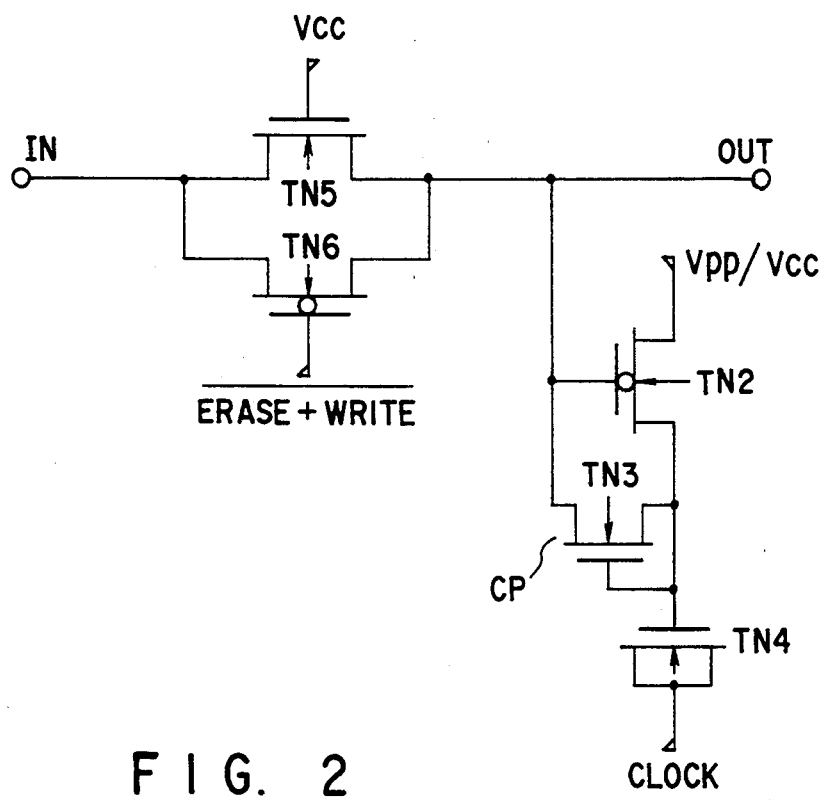
F I G. 2

LEVEL SHIFTER CIRCUIT CONSTITUTED OF E AND I TYPE TRANSISTORS AND AN EEPROM USING THE SAME

BACKGROUND OF THE INVENTION

1. Field of the Invention

The present invention relates to a level shifter circuit and an EEPROM (electrically erasable and programmable read only memory) using the same in a decorder section thereof.

2. Description of the Related Art

As well known in the art an EEPROM, one type of a nonvolatile semiconductor memory, is so configured that it constitutes a matrix array of cells and the cell of a given address is accessed by a row decoder (row selection) and column decoder (column selection).

FIG. 5 shows a circuit arrangement of a conventional EEPROM.

The erase, write and read operations of EEPROM will be explained below with reference to FIG. 5. An explanation given below is based on the description of Yasoji Suzuki "Semiconductor MOS Memory and How to Use It" published, by NIKKAN KOGYO Newspaper Publishing Company.

(1) Erase operation (electron injection)

First, the cell configuration of EEPROM per se will be explained below prior to the explanation of the erase operation.

Each of cells 00 to 30 in the cell matrix array CM is comprised of eight cells (8 bit segments) 000 to 007 as shown enlarged by a representing cell 00 in FIG. 5.

The control gates of memory transistors MT of the eight cells 000 to 007 in a lateral array are commonly connected and they are also connected to a select signal $C_0$ line via a transistor $G_{00}$.

It is to be noted that, though an output $RA_0$ of a row decoder RD is commonly input to the gate electrodes of select transistors ST of all cells 00, 10, 20 and 30 in a lateral array, the signal $C_0$ coming via the transistor $G_{00}$ is supplied only to the control gate electrodes of the eight memory transistors in the lateral cell array.

Though the output $RA_0$ of the row decoder RD is applied to the select gate electrode of the cell 10 as in the case of the cell 00, a $C_1$ line signal is supplied via the transistor $G_{10}$ to the control gate electrode of the memory transistor of the cell 10 unlike in the case of the cell 00.

This is because, except for a cell to be subjected to an erase operation, no high voltage is applied to the remaining cells at the erase operation.

The erase operation is performed as follows.

Let it be assumed that the cell 000 in the cell 00 is subjected to an erase operation. First, a signal "0" is applied to address input lines $A_0$ and $A_1$ of the row decoder RD and a high voltage 20 V is applied to an output line $RA_0$. A voltage 0 V is applied to output lines $RA_1$, $RA_2$ and $RA_3$. A signal "0" is applied to address input lines $A_2$ and $A_3$ of the column decoder CD and a voltage of 20 V is applied to an output line $CA_0$ and a voltage 0 V is applied to output lines $CA_1$, $CA_2$ and $CA_3$ of the column decoder CD.

Then a column select transistor $Q_0$ and a transistor $G_{00}$ of the cell 00 are turned ON, and an erase voltage signal $\alpha$ (=20 V) is applied to the control gate electrode of the cell 000 to that of the cell 007.

On the other hand, the bit line $B_{00}$ takes a potential $\beta$ via a data column select transistor $Tr_0$. Since here $\beta = 0$ V, each terminal of the cell 000 is placed in an erase (electron-injection) state. To be specific, a voltage "20 V" is applied to the select gate electrode and control gate electrode in the cell 000 and a voltage "0 V" is applied to the drain electrode of the select transistor ST.

At this time, the source electrode (shown by the mark of □ in FIG. 5) of the memory transistor MT is placed in a voltage level 0 V.

If any one of the bit lines $B_{00}$ to $B_{07}$ is given a level "0", an erase operation (electron injection) can be performed on the cells 000 to 007 in the cell 00 corresponding to that bit and a similar erase operation can also be performed on the other cells 01 to 33.

Since the control gate electrode of the cell 10 (actually 8 in number) adjacent the cell 00 is $RA_0 = 20$ V, the transistor $G_{10}$ is turned ON but the control gate electrodes of the eight memory transistors in the cell 10 do not become a high voltage because a column select transistor $Q_1$ is turned OFF. Therefore, it is possible to prevent the adjacent cell from being inadvertently erased (electron-injected) and hence to achieve high reliability at the erase operation.

(2) Write operation (electron release)

Performing a write operation on the cell 000 in the cell 00 will be explained below.

Let it be assumed that, as in the case of the erase operation, a signal "0" is applied to the address input lines $A_0$ and $A_1$ and a signal "0" is applied to the address input lines $A_2$ and $A_3$. In this state, $\alpha = 0$ V and $\beta = 20$ V.

Through a column select transistor $Q_0$ and the transistor $G_{00}$ in the cell 00 a voltage 0 V is applied to the control gate electrode of the cell 000 and a voltage 20 V is applied via a data column select transistor $Tr_0$ to the bit line $B_{00}$.

20 V = $RA_0$ is applied to the select gate electrode of the cell 000 and a write mode is involved. Electrons are released from the floating gate electrode of the memory transistor MT.

At this time, it is assumed that the source electrode of the memory transistor MT is placed in a 5 V level. In this way, a write operation (electron release) is carried out.

A write operation (electron release) is performed on the cell 000 and the bit line $B_{00}$ becomes a 20 V level. However, this effect, being exerted on the immediately overlying cell 01, will cause an operation error. To be specific, due to a high voltage (20 V) being applied to the bit line $B_{00}$ the cell 01 produces an operation error upon releasing electrons.

To prevent this adverse effect, the select transistor ST is added to each cell and, when a voltage 0 V appears on the output line $RA_1$ of the row decoder RD, the select transistor ST is turned OFF, thus eliminating such an effect resulting from high voltage involved.

Unlike an EPROM (erasable and programmable ROM), as set out above, EEPROM contains cells each comprised of two transistors so as to prevent any high voltage from being applied to those non-selected cells at a write operation and any data in those non-selected cells from being output to a bit line at a read operation.

(3) Read Operation

A high voltage (20 V) is not used in a read operation mode. A selected level shifter circuit LS of the decoder has its output set to be 5 V and a non-select shifter circuits LS of the decoder have their outputs to be set to be 0 V. Reading data out of the cell 000 in the cell 00 will be explained in more detail below.

When the cell 000 is to be selected, as in the case of the erase and write operations, a signal "0" is applied to the address input line $A_0$ and $A_1$ or to the address input lines $A_2$ and $A_3$. An output line $RA_0$ of the row decoder RD is set to be 5 V and an output line $CA_0$ of the column decoder CD is set to be 5 V.

In this mode, $\alpha = 0$ V.

In this state, the transistors $Q_0$ and $Tr_0$, as well as the transistors $G_{00}$ and select transistor ST, are turned ON and, therefore, a voltage $\alpha = 0$ V is applied to the control gate electrode in the cell 000 via the transistors $Q_0$ and $G_{00}$.

If, in this state, the cell 000 have been served as an erase (electron injection) cell, the memory transistor MT, being an enhancement type, is turned OFF.

Therefore, the cell 000 delivers no signal to the bit line $B_{00}$. The bit line $B_{00}$ is held at an about 1 V potential level by a pull-up element PU located at an upper side. The potential level of 1 V is detected by a sense circuit S as being data "1".

If, on the other hand, the cell 000 have been served as a write cell (electron release), the memory transistor MT, being a depletion type, is turned ON even in the event of the gate being 0 V.

Thus the bit line $B_{00}$ is pulled down toward a GND side via the select transistor ST. Since the pull-up element PU is connected to the tip of the bit line $B_{00}$, a DC path is created between the pull-up element PU and the cell 000 and a potential on the bit line $B_{00}$ drops down to about 0.2 V.

The potential level of 0.2 V is detected, by the sense circuit S, as being data "0".

In this way, the data "1" and "0" are read out of the cell 000 and a similar read operation can also be performed on the other cells.

Next, the level shifter circuit LS in the EEPROM circuit arrangement of FIG. 5 will be explained below in more detail and in relation with the present invention. FIG. 6 shows a symbol form of the level shifter circuit LS and FIG. 7 shows its circuit arrangement.

As shown in FIG. 7, the level shifter circuit LS comprises an N-channel D type transistor TN1 having a source electrode and a drain electrode connected to an input terminal IN and an output terminal OUT, respectively, and a gate electrode supplied with an inverted replica $\overline{(Erase + Write)}$ of a signal Erase+Write, that is, a signal 0 V at a time of erasing or writing operation and 5 V at the other operation, and a charge pump circuit CP connected to the output terminal OUT.

FIG. 8 shows one form of the charge pump circuit CP comprising an N-channel I type transistor TN2 and N-channel E type transistors TN3 and TN4.

FIGS. 9A and 9B and 10A and 10B are explanative views for explaining the operation of the level shifter circuit shown in FIGS. 7 and 8. The operation of the level shifter circuit incorporated into EEPROM (FIG. 5) will be explained below with reference to FIGS. 9A, 9B and 10A, 10B.

(1) Read Operation

As shown in FIG. 9A, an inverted replica $\overline{(Erase + Write)}$ of a signal Erase+Write is set to be 5 V and, therefore, an input signal 5 V is delivered to an output (5 V) via an N-channel D type transistor TN1 in a selected level shifter mode.

As shown in FIG. 10A, an input 0 V is delivered, via an N-channel D type transistor TN1, to an output (0 V) in a non-selected level shifter mode.

In the read operation, a charge pump circuit CP is set in a non-active state.

Here, the D type transistor TN1 is used as a means for preventing a voltage which is dropped by a portion $V_{TH}$ from an input voltage from appearing on the output side and for positively sending the input voltage to an output side. This is achieved since a threshold voltage ($V_{TH}$) of the D type transistor is a negative threshold voltage $-V_{TH}$.

(2) Erase/Write Operation

As shown in FIG. 9B, an inverted replica $\overline{(Erase + Write)}$ of a signal Erase+Write is set to a 0 V and an input 5 V is delivered via an N-channel D type transistor TN1 and appears as an output 2 V ($V_{TH}$ of a D type transistor TN1) in a selected level shifter mode. Only at the time of an erasing write operation, the voltage 2 V is boosted up by a charge pump circuit CP to 20 V (=Vpp).

As shown in FIG. 10B, an input signal 0 V is delivered via an N-channel D type transistor TN1 to an output (=0 V) in a non-selected level shifter mode.

Even in this case the charge pump circuit CP is in an active state and the input signal 0 V is not boosted up and appears as an output 0 V.

The above is an explanation concerning the operation of the level shifter circuit LS in EEPROM.

Here three types of N-channel transistors are required for the level shifter circuit LS:

a D type transistor having a negative threshold voltage $(-V_{TH})$, an I type transistor having a neutral threshold voltage ($V_{TH} \simeq 0$ V) and an E type transistor having a positive threshold voltage $(+V_{TH})$ In the form of the EEPROM circuit shown in FIG. 5 the N-channel D type transistor is employed for the level shifter circuit LS only. In order to fabricate the N-channel D type transistor it is necessary, from the manufacturing process of an LSI (large scale integrated circuit), that an additional 1PEP (Photoengraving process) be imparted to the D type $V_{TH}$ alignment ion implantation process.

Put it in another way, since the conventional EEPROM circuit uses an N-channel D type transistor for the level shifter circuit, one more 1PEP process is required in the LSI fabrication process, thus resulting in an increase in chip cost, an increase in the manufacturing time period and a drop in yield.

SUMMARY OF THE INVENTION

It is accordingly an object of the present invention to provide a level shifter circuit capable of dispensing with one more photoengraving process (1PEP) for D type $V_{TH}$ alignment ion implantation process, in the manufacture of an LSI such as an EEPROM circuit, without the need to use any N-channel D type transistor, and an EEPROM using such as level shifter circuits.

According to an aspect of the present invention a level shifter circuit is provided which comprise:

an input terminal for receiving an input signal oscillating between a first power source voltage and a second power source voltage in accordance with a selected mode and a non-selected mode;

an output terminal for delivering an output signal oscillating between the first and second power source voltages and a third power source voltage in accordance with a voltage conversion and a non-voltage conversion;

an N-channel E type transistor of a positive threshold voltage having a source electrode and a drain electrode connected between the input terminal and the output terminal and a gate electrode supplied with the first power source voltage;

an N-channel I type transistor of a neutral threshold voltage having a source electrode and a drain electrode connected between the input terminal and the output terminal and a gate electrode supplied with a control signal oscillating between the first power source voltage and the second power source voltage, the control signal determining whether or not the voltage conversion be made; and a charge pump circuit connected to the output terminal and operative with the first, second and third power source voltages such that the charge pump circuit is rendered active only at the voltage conversion operation.

In the level shifter circuit of the present invention, an N-channel D type transistor is replaced with a parallel circuit of the N-channel E type transistor and the N-channel I type transistor. Instead of three types of N-channel transistors, that is, the D-, E- and I-type, in a conventional level shifter circuit, the level shifter circuit of the present invention can use two types of N-channel transistors, that is, an E- and I-type, even when a charge pump circuit is built into the level shifter circuit.

According to another aspect of the present invention, an electrically erasable and programmable read only memory (EEPROM) includes a column decoder responsive to a predetermined address input to produce a selected signal or a non-selected signal relating to a column, a row decoder responsive to a predetermined address input to produce a selected signal or a non-selected signal relating to a row, a cell matrix array including a plurality of nonvolatile semiconductor memory cells connected to corresponding output lines of the selected signal and the non-selected signal relating to the column and the selected signal and the non-selected signal relating to the row and a predetermined number of level shifter circuits arranged between the column and row decoders and connection lines of the cell matrix array, the respective level shifter circuit comprising:

an input terminal for receiving an input signal oscillating between a first power source voltage and a second power source voltage in accordance with a selected mode and a non-selected mode;

an output terminal for producing an output signal oscillating between the first and second power source voltages and the third power source voltage in accordance with a voltage conversion and a non-voltage conversion;

a first N-channel E type transistor of a positive threshold voltage having a drain electrode and a source electrode connected between the input terminal and the output terminal and a gate electrode supplied with the first power source voltage:

a first N-channel I type transistor of a neutral threshold voltage having a drain electrode and a source electrode connected between the input terminal and the output terminal and a gate electrode supplied with a control signal oscillating between the first power source voltage and the second power source voltage, the control signal determining whether or not the voltage conversion be made; and a charge pump circuit connected to the output terminal and operative with the first, second and third power source voltages such that the charge pump circuit is rendered an active state only when the voltage conversion is made.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is an arrangement showing a level shifter circuit according to an embodiment of the present invention;

FIG. 2 is an arrangement showing a practical form of the level shifter circuit according to the present invention;

DETAILED DESCRIPTION OF THE PREFERRED EMBODIMENTS

FIG. 1 shows a level shifter circuit according to an embodiment of the present invention.

In the circuit shown in FIG. 1, an N-channel E type transistor TN5 and an N-channel I type transistor TN6 have their source and drain electrodes connected, as a parallel fashion, to an input terminal IN and an output terminal OUT, respectively. A power source Vcc is connected to the gate electrode of the N-channel E type transistor TN5 and an inverted replica $\overline{(\text{Erase}+\text{Write})}$ of a signal Erase+Write is input to the gate electrode of the N-channel I type transistor TN6. A charge pump circuit CP, together with the E and I type transistors TN5 and TN6, constitutes a level shifter circuit LS according to the present invention, connected to the output terminal OUT.

Figure 8:
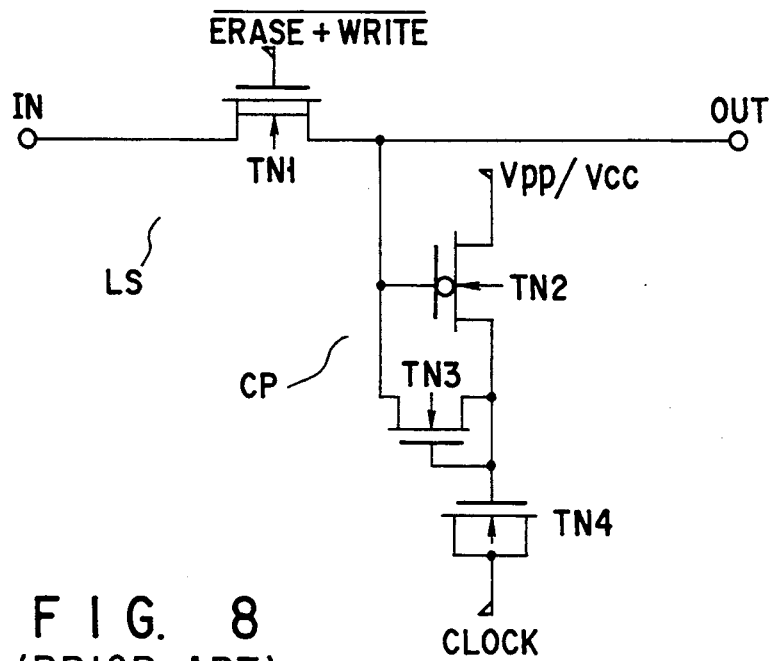
FIG. 8 is a view showing a practical form of the conventional level shifter circuit.
Figure 9A:
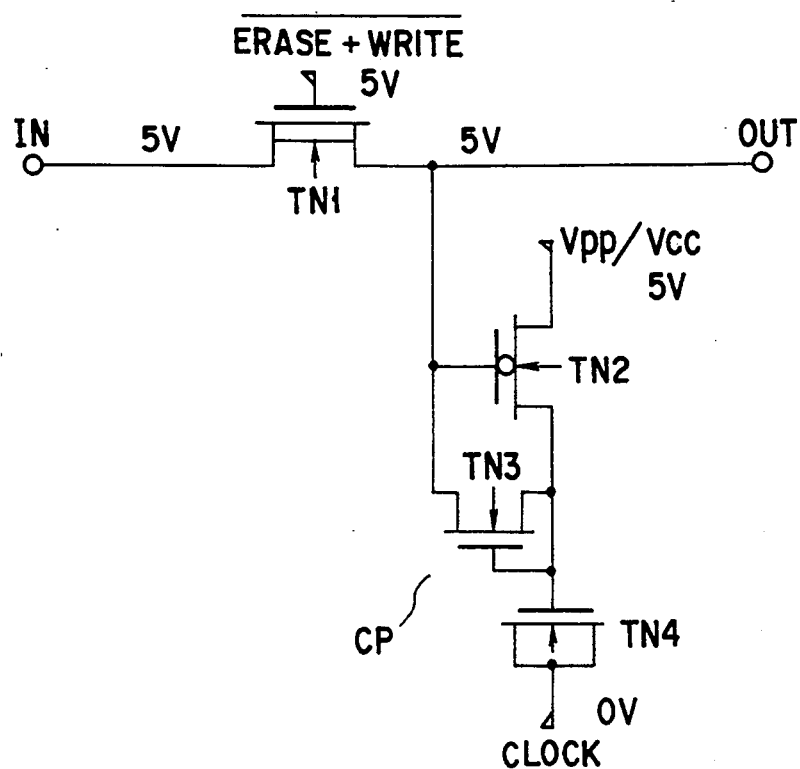
FIGS. 9A and 9B are views for explaining the operation of the conventional level shifter circuit.
Figure 9B:
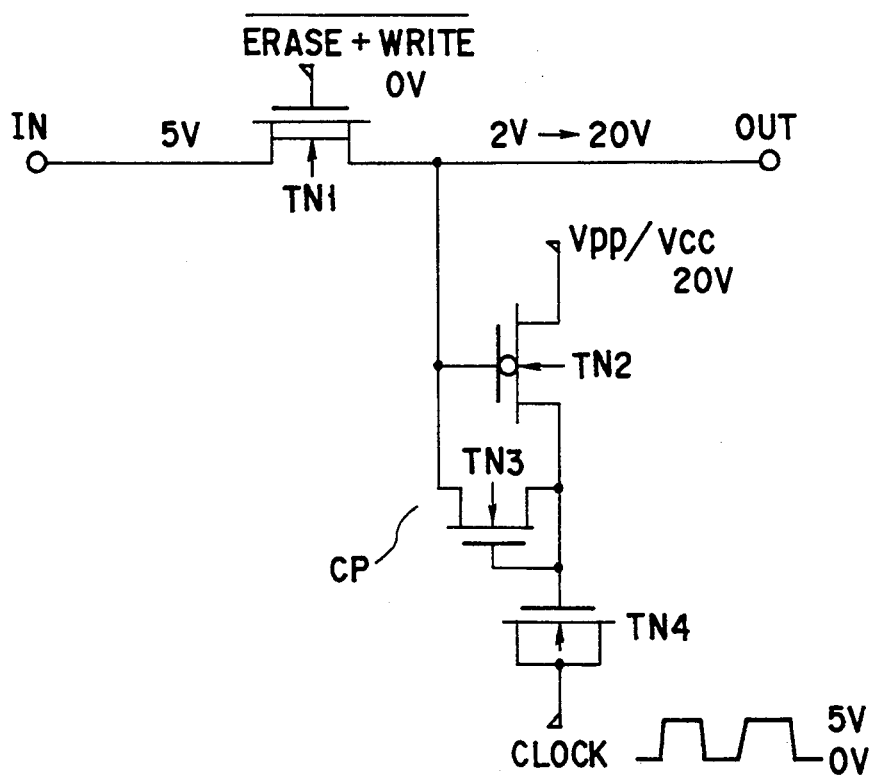
Figure 10A:
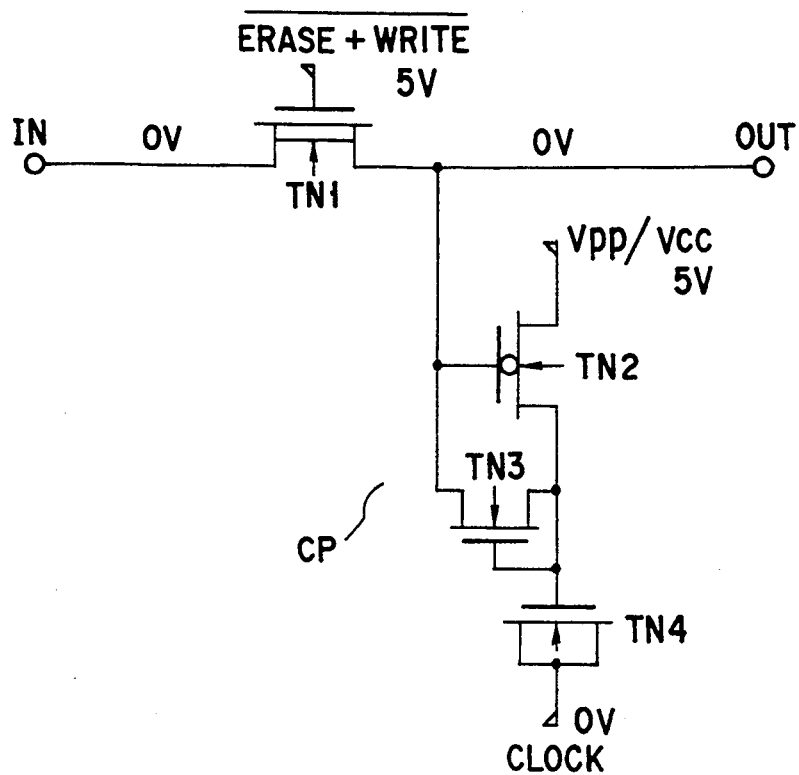
FIGS. 10A and 10B, each, are views for explaining the operation of a conventional level shifter circuit.
Figure 10B:
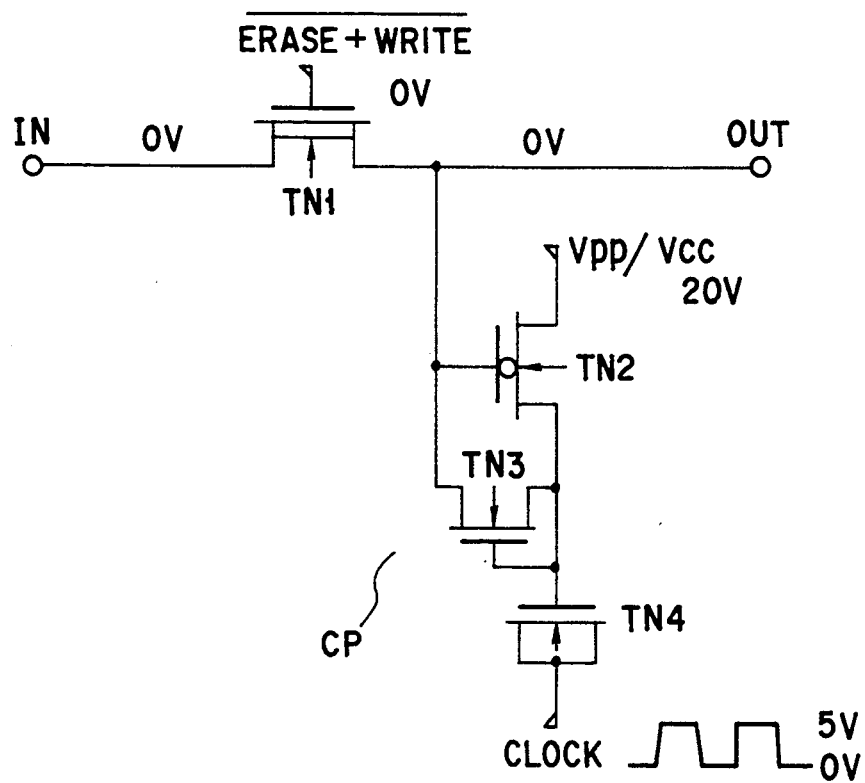

FIG. 2 shows a level shifter circuit having exactly the same charge pump circuit CP as those shown in FIG. 8, that is, one form of the charge pump circuit CP comprising an N-channel I type transistor TN2 and N-channel E type transistors TN3 and TN4.

To be specific, the charge pump circuit CP as shown in FIG. 2 is of such a type that an N-channel I type transistor TN2 has a gate electrode connected to an output OUT and a drain electrode connected to a power source Vpp or Vcc, an N-channel E type transistor TN3 has a source electrode connected to the output terminal OUT and a drain electrode and gate electrode connected to the source electrode of the N-channel I type transistor TN2 and an N-channel E type transistor TN4 has a gate electrode connected to the source electrode of the N-channel I type transistor TN2 and source and drain electrodes connected to a clock source Clock.

Here the voltage of a power source Vpp is set to 20 V (a third power source voltage) and the voltage of the power source Vcc is set to 5 V (a first power source voltage) and a clock signal originating from the clock source Clock is oscillated at a predetermined cycle in a range between 0 and 5 V.

That is, when 0 V is set as a second power source voltage, the charge pump circuit CP operates under the first, second and third power source voltages such that it may be placed in an active state only when a voltage conversion occurs in the level shifter circuit LS.

FIGS. 3A, 3B and 4A, 4B are explanative views showing the operation of the level shifter circuit LS as shown in FIGS. 1 and 2.

The respective operations of the prevent level shifter circuit LS incorporated into EEPROM (as shown in detailly FIG. 5) will be explained below with reference to FIGS. 3A, 3B and 4A, 4B.

(1) Read Operation

Figure 3A:
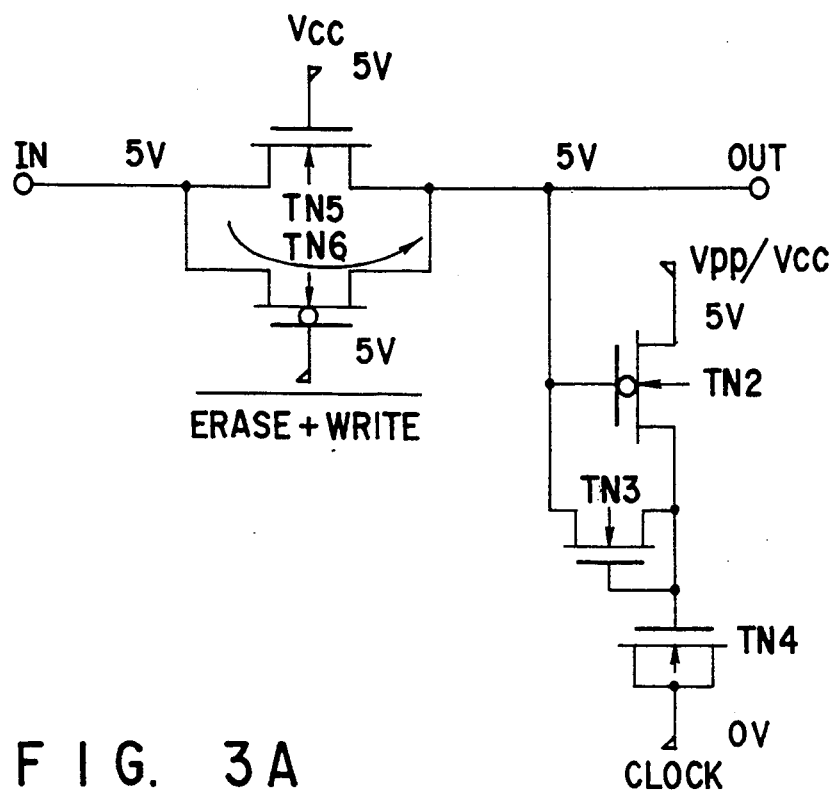
FIGS. 3A and 3B, each, are an explanative view showing the operation of the level shifter circuit according to the present invention.

Since, as shown in FIG. 3A, an inverted replica $\overline{(\text{Erase}+\text{Write})}$ of a signal Erase+Write is applied, as a 5 V signal, to the gate electrode of the N-channel I type transistor TN6, when in the case of EEPROM the 5 V signal (the first power source voltage) input from the column decoder CD or the row decoder RD as indicated by the broken line in FIG. 1 to the input terminal IN is applied via the N-channel I type transistor TN6 to the output terminal OUT as the 5 V (the first power source voltage) and, in the case of EEPROM, from there to the cell matrix array CM as indicated by the broken line in FIG. 1, in a selected level shifter mode.

Figure 4A:
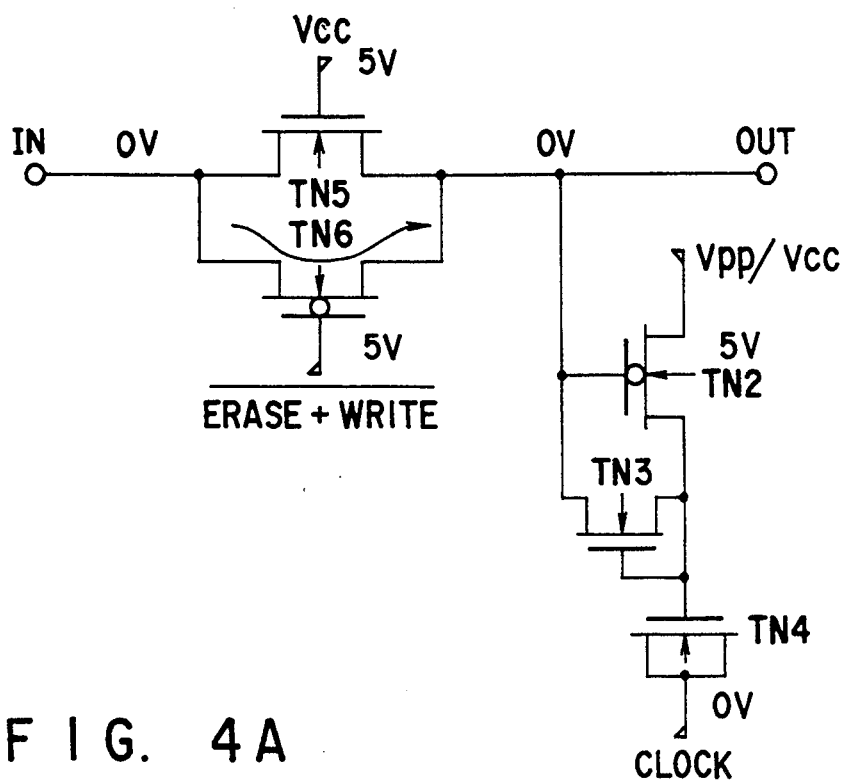
FIGS. 4A and 4B, each, are an explanative view showing the operation of the level shifter circuit according to the present invention.

As shown in FIG. 4A, an input signal (0 V = a second power source voltage) is similarly applied to the output terminal as the 0 V (the second power source voltage) via the N-channel I type transistor TN6 in a non-selected level shifter mode.

Here since the N-channel I type transistor TN6 has a nearly 0 V threshold voltage $V_{TH}$, it is possible to transmit, as an output voltage, a voltage nearly the same voltage as the input voltage.

At the time of read operation the N-channel E type transistor TN5 is not conducive to either the selected operation mode or the non-selected operation mode.

In these modes, since the clock source Clock is set to 0 V, the charge pump circuit CP is placed in a non-active state.

(2) Erase/Write Operation

In this operation, an inverted replica $\overline{(\text{Erase}+\text{Write})}$ of an input signal Erase+Write is set to 0 V and, therefore, the N-channel I type transistor NT6 is rendered nonconductive and not conducive to the erase/write operation. This time, the N-channel E type transistor TN5 takes part in the operation.

Figure 3B:
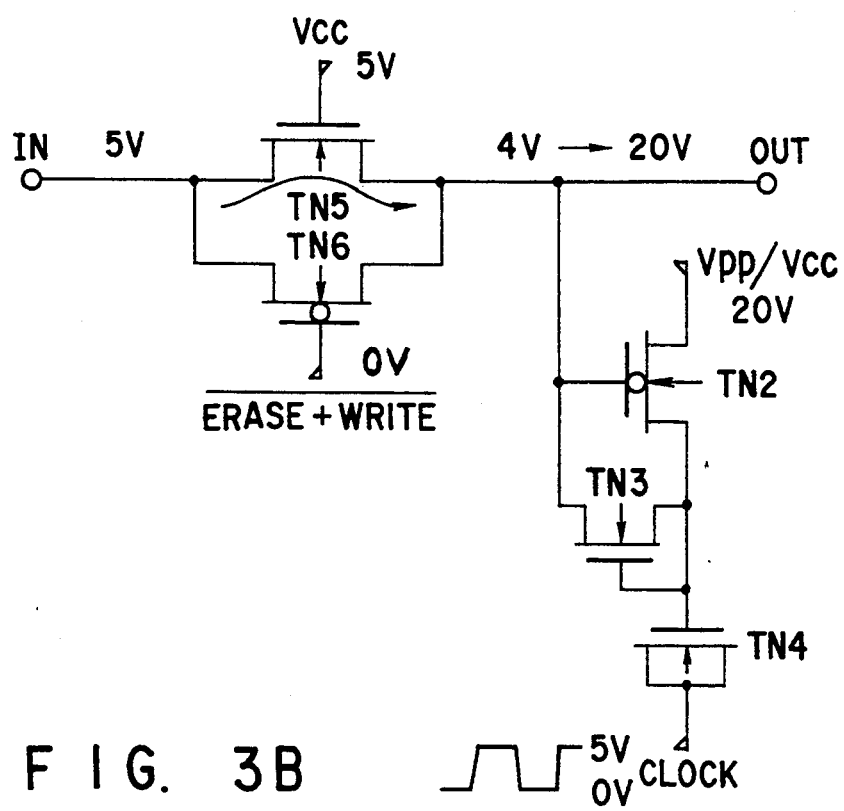

First as shown in FIG. 3B a 5 V input signal is applied to the input terminal IN, in a selected level shifter mode, to the drain electrode of the N-channel E type transistor TN5 with a 1 V (=$V_{TH}$) drop occurring in the N-channel E type transistor TN5, that is, as a 4 V signal to the drain electrode thereof. The 4 V signal is boosted up to 20 V (the third power source voltage=Vpp) by a charge pump circuit CP which is rendered active only at the time of the erase/write operation. The 20 V signal applied to the output terminal OUT as an output signal.

Figure 4B:
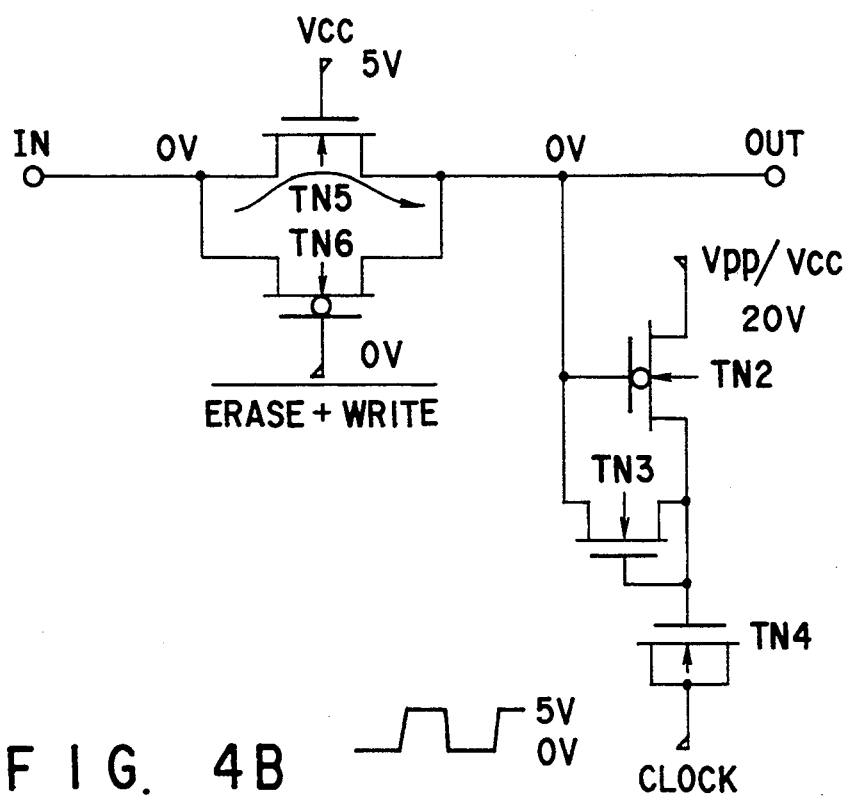

As shown in FIG. 4B, a 0 V input signal is applied, in a non-selected level shifter mode, to the output terminal OUT as a 0 V (the second power voltage source) via an N-channel E type transistor TN5. In this case, due to a charge pump circuit CP being rendered active the input signal is not boosted up and an output remains to be 0 V.

Figure 5:
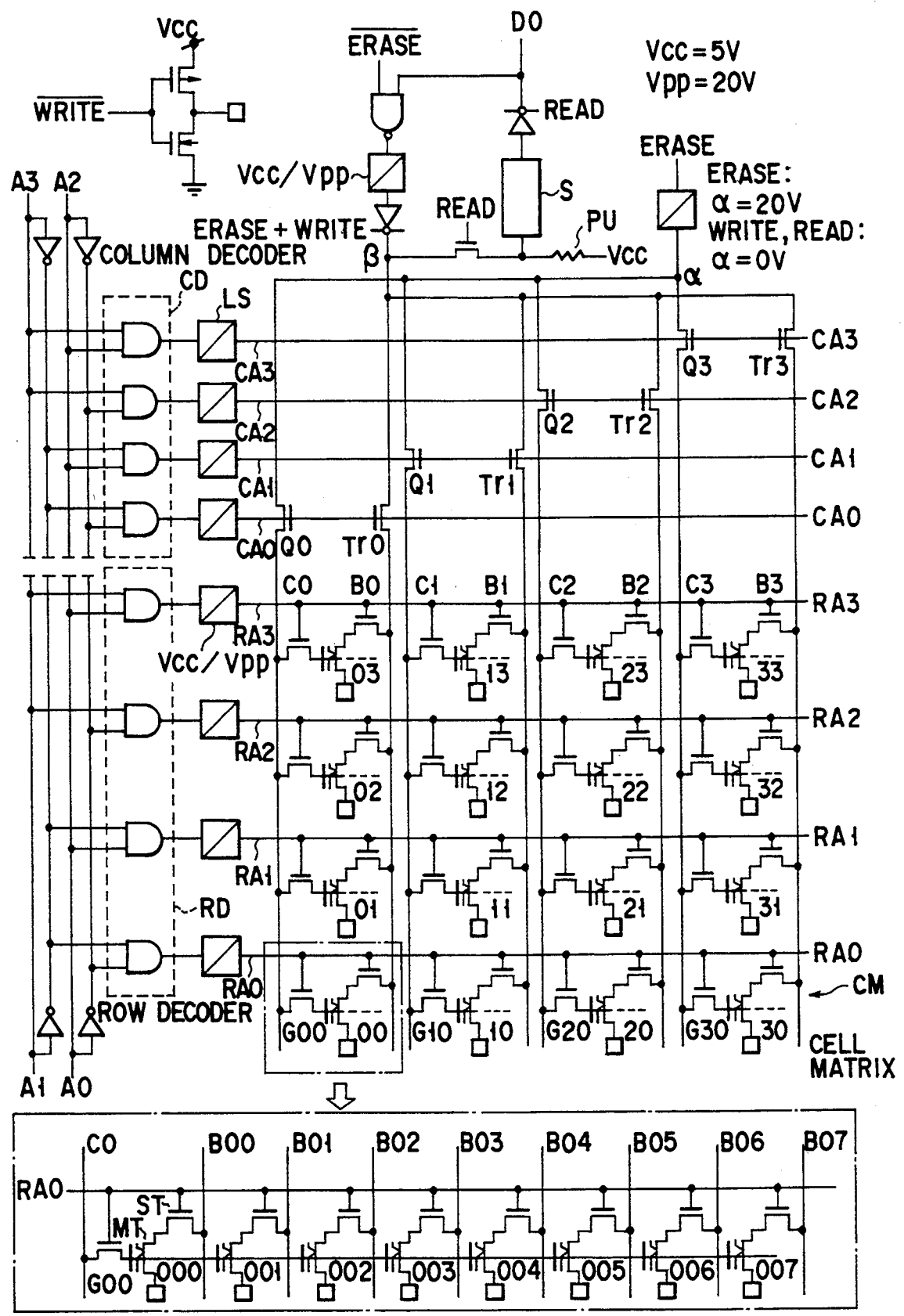
FIG. 5 is a view showing an arrangement of a conventional EEPROM.
Figure 6:
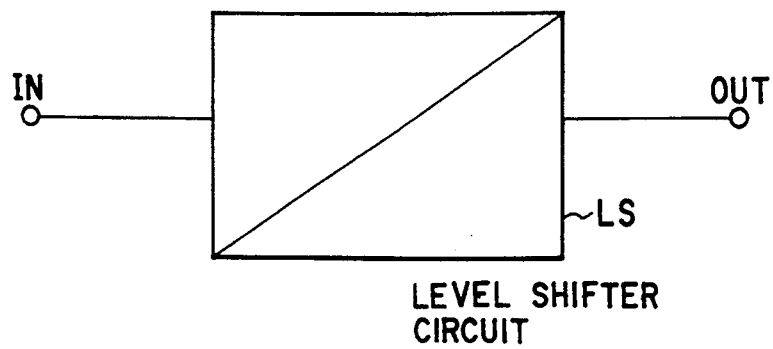
FIG. 6 shows a symbol form of the level shifter circuit used in the EEPROM as shown in FIG. 5.
Figure 7:
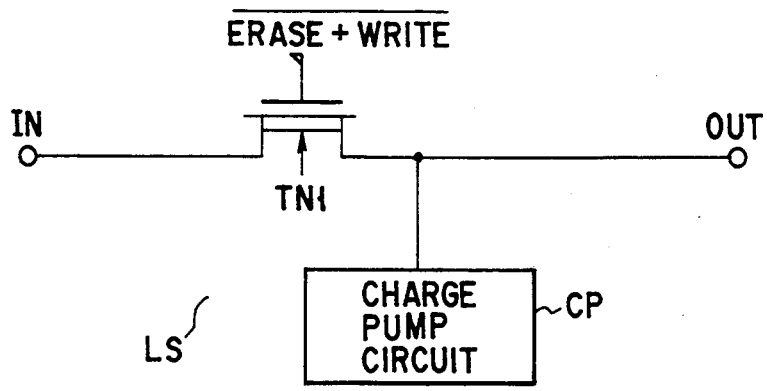
FIG. 7 is a view showing a conventional level shifter circuit.

Though showing only one level shifter circuit LS in FIG. 1, a predetermined number of lever shifter circuits LS are provided when being incorporated in EEPROM. A detail circuit arrangement of EEPROM is as shown in FIG. 5.

The above is an explanation concerning the respective operation of the present level shifter circuit when being incorporated in EEPROM.

Here only the two types of N-channel transistors, that is, the N-channel I type and E type, are required for the present level shifter circuit LS, thus eliminating the need to reduce one kind of transistor (N-channel D type transistor) which, together with the I type and E type, would be needed for the conventional level shifter circuit.

Further, according to the level shifter circuit LS of the present invention, one N-channel D type transistor is replaced with one N-channel E type transistor and one N-channel I type transistor in comparison with the counterpart of the conventional level shifter circuit and only one N-channel transistor increases for this case. Therefore, it takes no substantial increase in a chip area involved.

According to the present invention it is possible to provide a circuit configuration of the present invention without the use of the N-channel D type transistor and hence, from the standpoint of the manufacturing process of LSI's such as an EEPROM circuit, to dispense with one photoengraving process of an implantation process for D type $V_{TH}$ alignment for the fabrication of the N-channel D type transistor. As a result, according to the present invention a much better level shifter circuit, as well as an EEPROM, which can achieve a decrease in cost of chips, a shortening in the time period of manufacture required and an increase in yield when being applied in particular to EEPROM.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A level shifter circuit comprising:
    an input terminal for receiving an input signal oscillating between a first power source voltage and a second power source voltage according to a selected mode and non-selected mode;
    an output terminal for delivering an output signal oscillating between the first and second power source voltages and a third power source voltage;
    a first N-channel E type transistor having a drain electrode and a source electrode connected between the input terminal and the output terminal and a gate electrode supplied with the first power source voltage, the first N-channel E type transistor having a positive threshold voltage;

a first N-channel I type transistor having a source electrode and a drain electrode connected between the input terminal and the output terminal and a gate electrode applied with a control signal oscillating between the first power source voltage and the second power source voltage and determining whether or not a voltage conversion be made, the first N-channel I type transistor having a neutral threshold voltage; and a charge pump circuit connected to the output terminal and operative with the first, second and third power source voltages such that the charge pump circuit is rendered an active state only when the voltage conversion is made.

2. The level shifter circuit according to claim 1, wherein the input signal input to the input terminal is supplied from at least one of a column decoder and a row decoder in an electrically erasable and programmable read only memory (EEPROM) and the output signal delivered from the output terminal is supplied to a cell matrix array of the EEPROM.

3. The level shifter circuit according to claim 1, wherein the first power source voltage is at a first high level, the second power source voltage is at a low level and the third power source voltage is at a second high level higher than the first power source voltage.

4. The level shifter circuit according to claim 3, wherein the first high level is 5 V, the low level is 0 V and the second high level is 20 V.

5. The level shifter circuit according to claim 1, wherein the charge pump circuit comprise:

a second N-channel I type transistor having a gate electrode connected to the output terminal and a drain electrode selectively supplied with the second power source voltage or the third power source;

a second N-channel E type transistor having a source electrode connected to the output terminal and a drain electrode and a gate electrode commonly connected to a source electrode of the second N-channel I type transistor; and a third N-channel E type transistor having a gate electrode connected to the source electrode of the second N-channel I type transistor and a source electrode and a drain electrode commonly connected to a clock source.

6. The level shifter circuit according to claim 2, wherein the control signal input to the gate of the first N-channel I type transistor contains an inverted replica (Erase+Write) of a signal Erase+Write.

7. The level shifter circuit according to claim 6, wherein, when the EEPROM performs a read operation, the inverted replica (Erase+Write) is input with a voltage equal to the first power source voltage and the charge pump circuit is rendered a non-active state so that the first power source voltage or the second power source voltage input to the input terminal is output from the output terminal via the first N-channel I type transistor.

8. The level shifter circuit according to claim 6, wherein, when the EEPROM performs an erase operation or a write operation, the inverted replica (Erase+Write) is input with a voltage equal to the second power source voltage and the charge pump circuit is rendered an active state so that the first power source voltage or second power source voltage input to the input terminal passes through the first N-channel E type transistor and is boosted up by the charge pump circuit and the first power source voltage or second power source voltage is converted to the third power source voltage or second power source voltage and output from the output terminal.

9. The level shifter circuit according to claim 2, wherein the first power source voltage is at a first high level, the second power source voltage is at a low level and the third power source voltage is at a second high level higher than the first power source voltage.

10. The level shifter circuit according to claim 2, wherein the first high level is 5 V, the low level is 0 V and the second high level is 20 V.

11. An electrically erasable and programmable read only memory (EEPROM) including a column decoder responsive to a predetermined address input to produce a selected signal or a non-selected signal relating to a column, a row decoder responsive to a predetermined address input to produce a selected signal or a non-selected signal relating to a row, a cell matrix array including a plurality of nonvolatile semiconductor memory cells connected to corresponding output lines of the selected signal and the non-selected signal relating to the column and the selected signal and the non-selected signal relating to the row, and a predetermined number of level shifter circuits arranged between the column and row decoders and connection lines of the cell matrix array, the respective level shifter circuit comprising:

an input terminal for receiving an input signal oscillating between a first power source voltage and a second power source voltage in accordance with a selected mode and a non-selected mode;

an output terminal for producing an output signal oscillating between the first and second power source voltages and a third power source voltage in accordance with voltage conversion and non-voltage conversion;

a first N-channel E type transistor having a drain electrode and a source electrode connected between the input terminal and the output terminal and a gate electrode supplied with the second power source voltage, the first N-channel E type transistor having a positive threshold voltage;

a first N-channel I type transistor having a drain electrode and a source electrode connected between the input terminal and the output terminal and a gate electrode applied with a control signal oscillating between the first power source voltage and the second power source voltage and determining whether or not the voltage conversion operation be made, the first N-channel I type transistor having a neutral threshold voltage; and a charge pump circuit connected to the output terminal and operative with the first, second and third power source voltages such that the charge pump circuit is rendered an active state only when the voltage conversion is mode.

12. The EEPROM according to claim 11, wherein the first power source voltage is at a first high level, the second power source voltage is at a low level and the third power source voltage is at a second high level higher than the first power source voltage.

13. The EEPROM according to claim 12, wherein the first high level is 5 V, the low level is 0 V, and the second high level is 20 V.

14. The EEPROM according to claim 11, wherein the charge pump circuit comprises:
- a second N-channel I type transistor having a gate electrode connected to the output terminal and a drain electrode selectively supplied with the second power source voltage or the third power source voltage;
- a second N-channel E type transistor having a source electrode connected to the output terminal and a drain electrode and a gate electrode commonly connected to a source electrode of the second N-channel I type transistor; and
- a third N-channel E type transistor having a gate electrode connected to the source electrode of the second N-channel I type transistor and a source electrode and drain electrode commonly connected to a clock source.

15. The EEPROM according to claim 11, wherein the signal input to the gate electrode of the first N-channel I type transistor includes an inverted replica $\overline{(Erase+Write)}$ of a signal Erase+Write.

16. The EEPROM according to claim 15, wherein, when the EEPROM performs a read operation, the inverted replica $\overline{(Erase+Write)}$ is input with the same voltage as the first power source voltage and the charge pump circuit is rendered an active state so that the first power source voltage or second power source voltage is output from the output terminal via the first N-channel I type transistor.

17. The EEPROM according to claim 15, wherein, when the EEPROM performs an erase operation or a write operation, the inverted replica $\overline{(Erase+Write)}$ is input with the same voltage as the second power source voltage and the charge pump circuit is rendered an active state so that the first power source voltage or second power source voltage input to the input terminal passes through the first N-channel E type transistor and is boosted by the charge pump circuit up and the first power source voltage or second power source voltage is converted to the third power source voltage or the second power source voltage and output from the output terminal.

* * * * *